(12) United States Patent  
Koh

(10) Patent No.: US 6,555,434 B2
(45) Date of Patent: Apr. 29, 2003

(54) NONVOLATILE MEMORY DEVICE AND MANUFACTURING METHOD THEREOF

(75) Inventor: Chao-Ming Koh, Hsinchu Hsien (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/143,798

(22) Filed: May 14, 2002

(65) Prior Publication Data

US 2003/0013250 A1 Jan. 16, 2003

Related U.S. Application Data

(62) Division of application No. 09/903,611, filed on Jul. 13, 2001, now abandoned.

(51) Int. Cl.[7] .......................................... H01L 21/8247
(52) U.S. Cl. ...................... 438/257; 438/296; 438/593
(58) Field of Search ................. 438/257–267, 438/296, 593

(56) References Cited

U.S. PATENT DOCUMENTS 6,171,909 B1    1/2001   Ding et al. ............... 438/267
6,274,434 B1 *  8/2001   Koido et al. .............. 438/266

* cited by examiner

*Primary Examiner*—Richard Booth
(74) *Attorney, Agent, or Firm*—Intellectual Property Solutions, Incorporated

(57) ABSTRACT

A nonvolatile memory device with a high coupling ratio is disclosed. The nonvolatile memory device includes a semiconductor substrate having shallow trench isolation (STI) formed therein and active regions defined. On the active regions, a floating gate is provided with a gate dielectric layer interposed. On the floating gate, a control gate is provided with a second dielectric layer interposed. The width of the floating gate is narrower than the active regions when viewed in transverse cross-section. A lighted doped region is optionally provided in the substrate at positions which are not covered by the floating gate. A manufacturing method for forming such memory device is also disclosed.

9 Claims, 4 Drawing Sheets

NONVOLATILE MEMORY DEVICE AND MANUFACTURING METHOD THEREOF

This application is a division of application Ser. No. 09/903,611, filed Jul. 13, 2001, now abandoned.

BACKGROUND OF THE INVENTION

1. Field of the Invention

The present invention generally relates to a nonvolatile semiconductor memory device such as an EPROM (erasable programmable read only memory), EEPROM (electrically erasable programmable read only memory) and a flash memory. The present invention also relates to a method of manufacturing such a nonvolatile semiconductor memory device.

2. Description of the Related Arts

High-density nonvolatile memory devices have been receiving much attention for application in many fields. One of the most important factors is the low cost of the reduced size of each memory cell. However, it is very difficult to shrink the cell size in the fabrication of nonvolatile memory cells when the conventional local oxidation (LOCOS) isolation technique is used. The isolation structure formed by this technique has a very large dimension and thus limits the miniaturization of the memory cells.

Another isolation technique called shallow trench isolation (STI) has been introduced to the fabrication of nonvolatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the coupling ratio, which is a parameter that describes the coupling to floating gate of the voltage applied to control gate. The poorly-coupled voltage to floating gate limits the programming and accessing speed characteristics of the memory device.

The coupling ratio Cp is defined by:

$$Cp = \frac{Ccf}{Ccf + Cfs}$$

where Ccf is capacitance between the control gate and the floating gate; and Cfs is capacitance between the floating gate and the semiconductor substrate.

In order to gain programming and accessing speeds in nonvolatile memories, many attempts have been done to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp. However, such attempts often come with the additional expense or limitation in processing the device. For example, U.S. Pat. No. 6,171,909 discloses a method for forming a stacked gate of a flash memory cell. The coupling ratio of the stacked gate is increased by forming a conductive spacer. The conductive spacer, which is a portion of the floating gate, increases the capacitor area between the floating gate and control gate. Nevertheless, this method is quite complicated and incurs additional cost. Accordingly, the coupling ratio generally cannot be improved in an easy and cost effective manner.

In the present invention, a nonvolatile semiconductor memory device with an increased coupling ratio is disclosed. This is accomplished by reducing the capacitance Cfs between the floating gate and the semiconductor substrate, rather than by increasing the capacitance Ccf between the control gate and the floating gate.

SUMMARY OF THE INVENTION

An object of the invention is to provide a nonvolatile semiconductor memory device having a high coupling ratio.

Another object of the invention is to provide a simple method of manufacturing a nonvolatile semiconductor memory device with a high coupling ratio.

The above and other objects and advantages are achieved by reducing the capacitor area between the floating gate and the semiconductor substrate by a single thermal oxidation process. The smaller capacitor area decreases the capacitance Cfs between the floating gate and the semiconductor substrate, and thus obtains a higher coupling ratio.

According to an aspect of the invention, there is provided a nonvolatile memory device comprising: a semiconductor substrate having shallow trench isolation (STI) formed therein and active regions defined; a floating gate provided on the active regions with a first dielectric layer interposed; and a control gate formed on the floating gate with a second dielectric layer interposed therebetween; wherein the width of the floating gate is narrower than the active regions when viewed in transverse cross-section. Optionally, the device further includes a lightly doped region in the substrate at positions which are not covered by the floating gate.

According to another aspect of the invention, there is provided a method for forming a nonvolatile memory device comprising the steps of: forming a gate oxide layer on a silicon substrate; forming a first polysilicon layer on the gate oxide layer for serving as a floating gate of the memory device; patterning the first polysilicon layer, the gate oxide layer, and the substrate to form trenches in the substrate and to form a floating gate on an active region separated by the trenches with a patterned gate oxide layer interposed; and thermally oxidizing the first polysilicon layer, thereby narrowing the width of the floating gate relative to the active region.

To complete the fabrication of the memory device, the method may further includes the following steps: forming isolation oxide in the trenches to form shallow trench isolation (STI); optionally forming a lightly doped region in the substrate at positions which are not covered by the floating gate; and sequentially forming an interpoly oxide layer and a second polysilicon layer for serving as a control gate of the memory device over the substrate.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Figure 1:
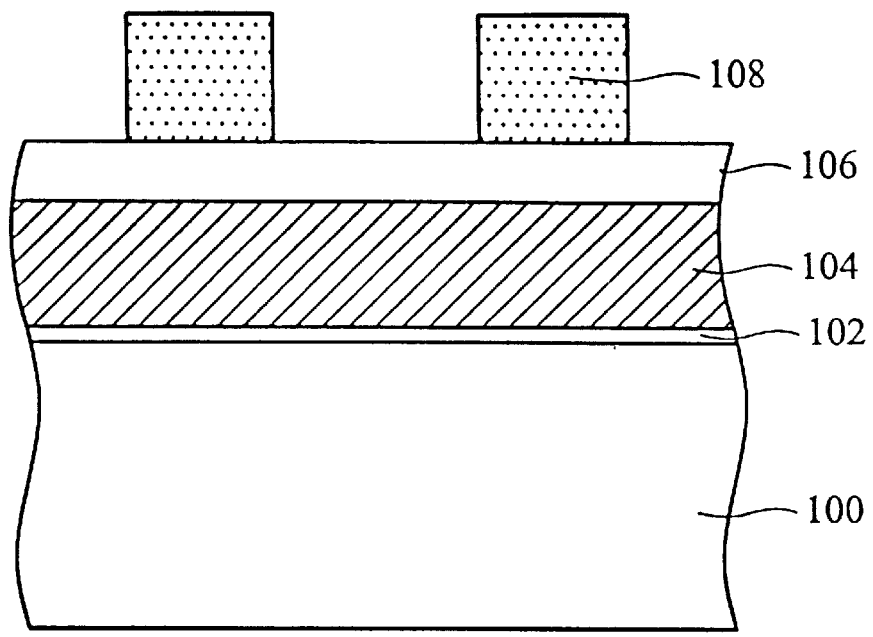
FIGS. 1 through 7 are cross-sectional views illustrating the steps for fabricating a nonvolatile memory device according to a preferred embodiment of the invention.

There will now be described an embodiment of this invention with reference to the accompanying drawings. Referring to FIG. 1, on a surface of a silicon semiconductor substrate 100, a gate oxide layer 102, a first polysilicon layer 104, and a silicon nitride layer 106 are sequentially formed. The gate oxide layer 102 has a thickness between about 70 to 100 Å. It can be formed by a thermal oxidation process at a temperature between about 750° C. to 950° C. Alternatively, the gate oxide can be formed by an atmospheric or low pressure chemical vapor deposition (LPCVD) process as is well known.

The first polysilicon layer 104 is formed over the gate oxide layer 102 through methods including but not limited to Chemical Vapor Deposition (CVD) methods employing suitable silicon source materials, preferably formed through a LPCVD method employing silane ($SiH_4$) as a silicon source material at a temperature range between about 530° C. to 650° C. The first polysilicon layer 104 is preferably doped with an impurity such as phosphorus. Doping can occur using $POCl_3$ diffusion, in-situ doping techniques, and implantation techniques.

The silicon nitride layer 106 is formed over the first polysilicon layer 104 for serving as a hard mask. Therefore, other materials suitable for acting as a hard mask can be used to replace the silicon nitride layer. The silicon nitride layer 106 is usually formed by reacting dichlorosilane ($SiCl_2H_2$) with ammonia ($NH_3$) through an LPCVD process.

Figure 2:
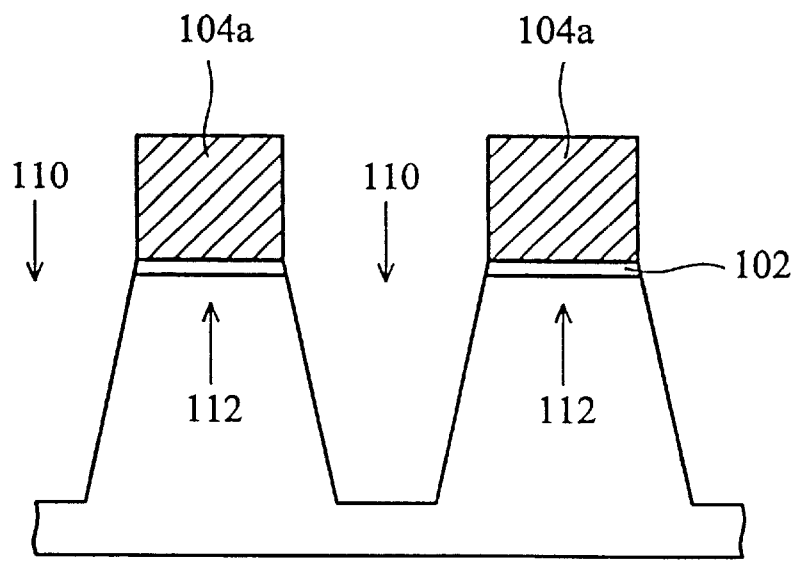

Referring to FIGS. 1 and 2, a photoresist pattern 108 is formed over the silicon nitride layer 106 to protect all areas on which active devices will later be formed. Using the photoresist pattern 108 as an etching mask, the silicon nitride layer 106, the first polysilicon layer 104, and the underlying gate oxide layer 102 are dry etched. The etching is further carried into the substrate 100 to form shallow trenches 110 separating active regions 112. A stack of a gate oxide layer 102 and a floating gate 104a formed from the first polysilicon layer 104 is defined. The photoresist pattern 108 and the silicon nitride layer 106 over first polysilicon layer is removed after using them to define active regions.

Figure 3:
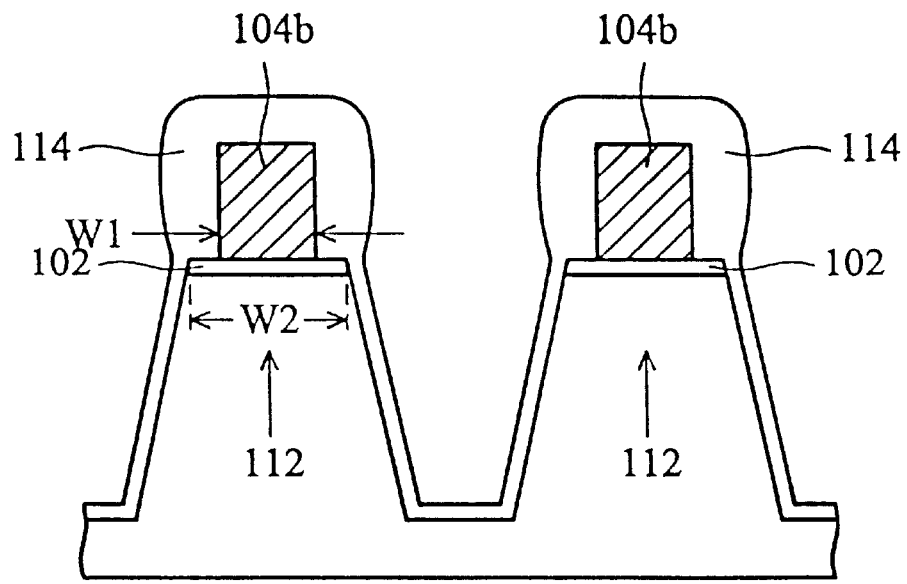

Next, referring to FIG. 3, as a main feature and a key aspect of the present invention, a thermal oxidation process is performed to create a smaller geometric area between the floating gate and the semiconductor substrate. In the thermal oxidation, the surfaces of the trenches 110 and the floating gate 104a are oxidized to form an oxide liner 114. The oxide liner 114 is thicker at the positions surrounding the floating gate 104b while is thinner at the positions lining the trench 100. This is because polysilicon in nature has a higher oxidation rate than crystalline Si, more silicon is consumed in the polysilicon layer than in the silicon substrate. Therefore, the resulting floating gate 104b has a smaller bottom surface area relative to the active region 112, and as illustrated in the cross-sectional view, the floating gate 104b has a width W1 narrower than the width W2 of the active region 112. As a consequence, the capacitance Cfs between the floating gate and the semiconductor substrate decreases and the coupling ratio increases. According to the invention, this thermal oxidation process is preferably performed at a temperature between about 700° C. to 1100° C. and continued for a period from about 20 to 120 seconds.

Figure 4:
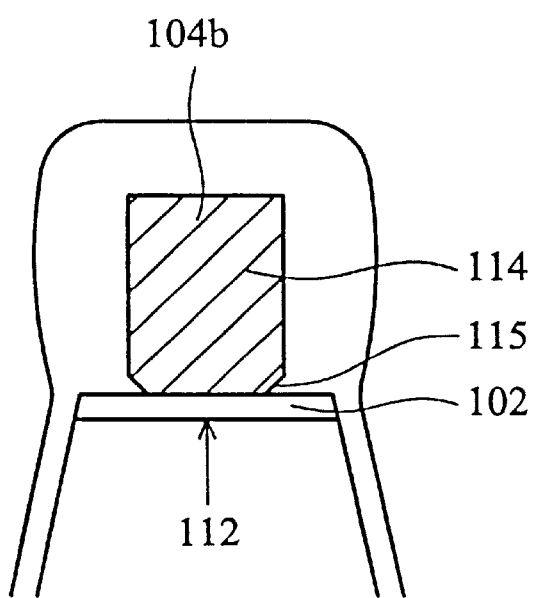

FIG. 4 is a partially enlarged view of FIG. 3, which illustrates an undercut edge 115 of the floating gate 104b. This undercut region 115 is due to the polysilicon at the interface between the gate oxide 102 has a higher oxidation rate than at the other portions. The undercut edge further reduces the capacitance Cfs between the floating gate and the semiconductor substrate and increases the coupling ratio.

Figure 5:
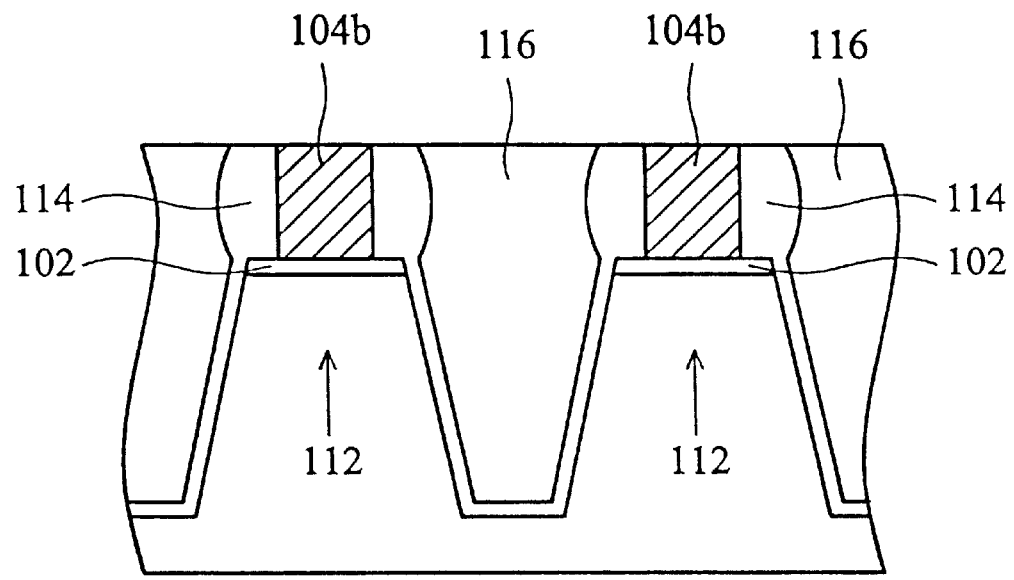

Referring to FIG. 5, an isolation oxide layer 116 is deposited using the method of high density plasma (HDP) deposition or LPCVD to overfill the trenches 110. The thickness of the isolation oxide layer 116 is sufficient to cover the floating gate 104b. Then, a chemical-mechanical polishing (CMP) process is performed to planarize the oxide layer 116 until the top surface of the floating gate 104b is exposed.

Figure 6:
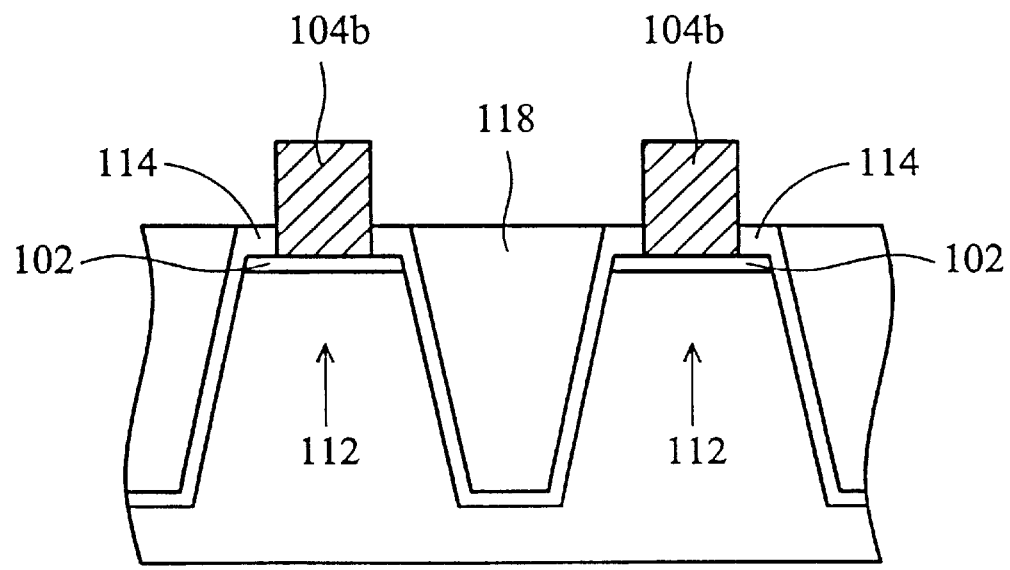

Referring to FIG. 6, the isolation oxide layer 116 as well as the oxide liner 114 are etched back to expose an upper portion of the floating gate 104b, thus forming shallow trench isolation (STI) 118. As illustrated, the shallow trench isolation 118 has a surface level between the top surface and the bottom surface of the floating gate 104b. This etching step can be performed by either dry etching or wet etching.

Figure 7:
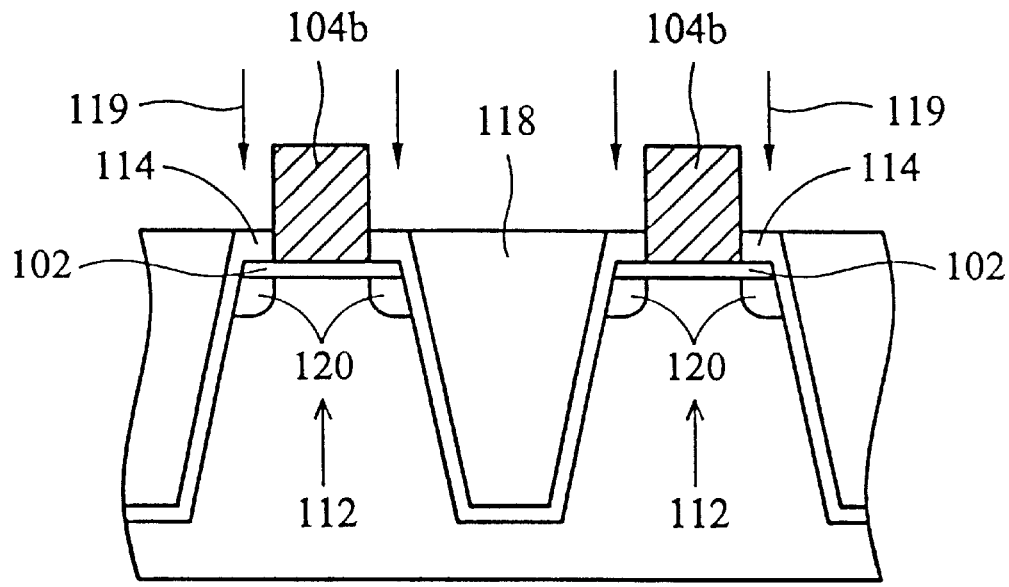

In a preferred embodiment of the invention, the substrate 100 is implanted with P type impurities using the floating gate 104b as an implanting mask. Referring to FIG. 7, the P type implant 119 forms $P^-$ type diffusion regions 120 in the substrate at positions which are not covered by the floating gate 104b. The $P^-$ type regions 120 prevents the memory device from non-gate channel inversion and improve the threshold voltage (Vt) stability.

Figure 8:
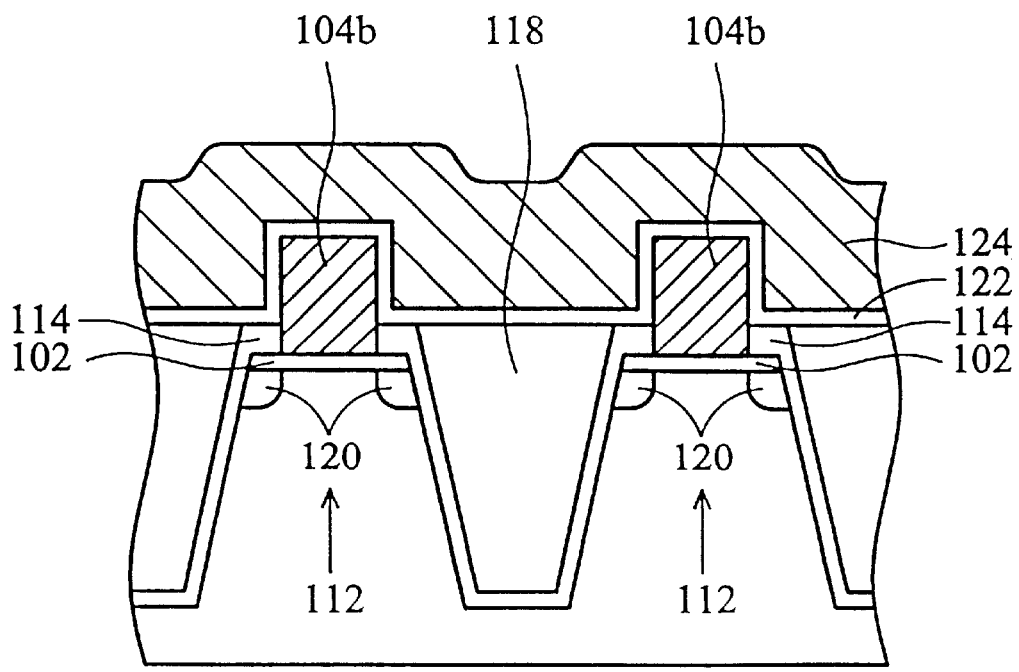
FIG. 8 illustrates a nonvolatile memory device according to a preferred embodiment of the invention.

Referring to FIG. 8, an interpoly oxide layer 122 and a second polysilicon layer 124 for serving as a control gate layer are sequentially formed over the substrate 100. The interpoly oxide layer 122 typically comprises oxide/nitride/oxide (ONO) formed through methods known in the art. The second polysilicon layer 124 is typically made of doped polysilicon. Subsequently, a masking and etching process is performed to define a control gate from the second polysilicon layer 124. A nonvolatile memory device with a larger coupling ratio is formed.

Therefore, the nonvolatile memory device according to the invention includes shallow trench isolation 118 which are used to isolate the active regions 112. On the active regions 112, a floating gate 104b is provided with a gate dielectric layer 102 interposed. On the floating gate 104b, a control gate 124 is provided with a second dielectric layer 122 interposed. The width of the floating gate 104b is narrower than the active regions 112 when viewed in transverse cross-section. A lighted doped region 120 is optionally provided in the substrate at positions which are not covered by the floating gate.

Accordingly, the present invention provides a relatively simple structure to increase a coupling ratio of a nonvolatile memory device. The increased coupling ratio leads to lower voltages needs to program the device. Additionally, the present invention provides a simple method for increasing the coupling ratio of a nonvolatile memory device. The fabrication method is easier and uses less steps than conventional techniques. By way of easier fabrication steps, the present invention may provide higher device yields and better device reliability.

While the invention has been particularly shown and described with reference to the preferred embodiment thereof, it will be understood by those skilled in the art that various changes in form and details may be made without departing from the spirit and scope of the invention.

What is claimed is:

1. A method for forming a nonvolatile memory device, comprising the steps of:

forming a gate oxide layer on a silicon substrate;

forming a first polysilicon layer on said gate oxide layer for serving as a floating gate of said memory device;

patterning said first polysilicon layer, said gate oxide layer, and said substrate to form trenches in said substrate and to form a floating gate on an active region separated by said trenches with a patterned gate oxide layer interposed;

thermally oxidizing surfaces of said first polysilicon layer and said trenches to form a liner oxide layer, thereby narrowing the width of said floating gate relative to said active region;

forming isolation oxide in said trenches to form shallow trench isolation (STI);

forming a lightly doped region in said substrate at positions which are not covered by said floating gate; and sequentially forming an interpoly oxide layer and a second polysilicon layer for serving as a control gate of said memory device over said substrate.

2. The method as claimed in claim 1, wherein the step of patterning said first polysilicon layer, said gate oxide layer, and said substrate comprises using a silicon nitride layer as a hard mask.

3. The method as claimed in claim 1, wherein the step of forming isolation oxide in said trenches comprises:

forming an oxide layer over the substrate, wherein a thickness of the oxide layer is sufficient to cover said floating gate;

chemical-mechanical polishing said oxide layer until a top surface of said floating gate is exposed; and etching back the oxide layer and said liner oxide layer to expose an upper portion of said floating gate.

4. The method as claimed in claim 1, wherein said first polysilicon layer is a doped polysilicon layer.

5. The method as claimed in claim 1, wherein said second polysilicon layer is a doped polysilicon layer.

6. The method as claimed in claim 1, wherein said interpoly oxide layer is an oxide/nitride/oxide (ONO) layer.

7. The method as claimed in claim 1, wherein the step of thermally oxidizing said polysilicon layer is performed at a temperature between about 700° C. and 1100° C.

8. The method as claimed in claim 1, wherein said floating gate has a smaller bottom surface area relative to said active region after the step of thermally oxidizing said polysilicon layer.

9. The method as claimed in claim 1, wherein said floating gate has an undercut edge after the step of thermally oxidizing said polysilicon layer.

* * * * *